United States Patent [19]
Stoyko

[11] Patent Number: 5,532,427
[45] Date of Patent: Jul. 2, 1996

[54] ELECTRICALLY CONDUCTIVE JOINT

[75] Inventor: Michael T. Stoyko, Newberg, Oreg.

[73] Assignee: Gerome Manufacturing Company, Inc., Uniontown, Pa.

[21] Appl. No.: 328,141

[22] Filed: Oct. 24, 1994

[51] Int. Cl.⁶ ....................................................... H05K 9/00
[52] U.S. Cl. ........................ 174/35 R; 29/505; 174/35 C; 174/356 C; 361/818
[58] Field of Search ............................... 174/35 R, 35 C, 174/35 MS, 356 C; 361/816, 818; 428/209; 29/505; 220/682

[56] References Cited

U.S. PATENT DOCUMENTS

| | | | |
|---|---|---|---|
| 2,876,275 | 3/1959 | Schulz | 174/35 R |
| 3,340,587 | 9/1967 | Beyer | 29/155 |
| 4,609,104 | 9/1986 | Kasper et al. | 206/334 |
| 4,652,695 | 3/1987 | Busby | 174/365 C |
| 4,857,668 | 8/1989 | Buonanno | 174/356 C |
| 5,028,740 | 7/1991 | Tomiya | 174/35 R |
| 5,045,635 | 9/1991 | Kaplo et al. | 174/356 C |
| 5,198,290 | 3/1993 | Niioka | 428/263 |

*Primary Examiner*—Laura Thomas
*Assistant Examiner*—Christopher Horgan
*Attorney, Agent, or Firm*—Armstrong, Westerman, Hattori, McLeland & Naughton

[57] ABSTRACT

An electrically conductive joint and method of making, which includes off-setting a portion of one end of a composite sheet having a conductive layer and an insulative layer, bending a part of the off-set portion into a first leg with the insulative layer on the outside of the bend, bending an edge portion of a second end of the sheet into a second leg with the insulative layer on the inside of the bend, juxtaposing the two legs and compressing them to form a continuous contact between the conductive layers of the two ends.

9 Claims, 3 Drawing Sheets

ELECTRICALLY CONDUCTIVE JOINT

BACKGROUND OF THE INVENTION

1. Field of the Invention

This invention relates to an electrically conductive joint, and more specifically to a joint formed of a strip of electrically conductive material having one surface coated with an electrically insulating coating, and which joint is useful in the fabrication of magnetic shielding for electrical apparatus.

2. Related Prior Art

It is known in the prior art to provide hollow housings for magnetic shielding of electrical apparatus. For example, U.S. Pat. No. 5,028,740 discloses such a housing comprising an electrically conductive sheet, one surface of which is coated the an insulating material such as a paint, resin, etc. A joint is formed by bending one end of a sheet of such material into a hairpin shape and connecting that bent end to the other end of the sheet by means of rivets or screws.

U.S. Pat. No. 2,876,275 shows a shielding panel comprising a rigid member, such as plywood, provided with a metal sheathing terminating in L-shaped portions which can be locked together to provide continuity of electrical conductivity from panel-to-panel.

U.S. Pat. No. 3,340,587 discloses electromagnetic shielding enclosures wherein panels are disposed in edge-to-edge relationship, with U-shaped spring clips into which panel flanges are inserted to provide an electrically continuous wall of panels.

U.S. Pat. No. 5,198,290 discloses an electromagnetic shielding material comprising a flexible base fabric, a first metallic film formed by flame-spraying a metal, such as Zn, on one side of the fabric, and a second metallic film, such as Al foil, formed on the other side of the fabric. No joint is shown.

U.S. Pat. No. 4,652,695 discloses a clip enclosing an end of a knit mesh material and adapted to be installed around the periphery of a door in a shielding enclosure to maintain electrical continuity in the enclosure.

None of such prior art provides a joint in a conductive metal sheet having one insulated surface, formed only by bending the sheet.

SUMMARY OF THE INVENTION

Therefore it is an object of the invention to provide an electrically conductive joint of a sheet of conductive material coated on one surface thereof with an electrically insulating material merely by properly bending the composite sheet material. This is done by providing one end of the sheet with an off-set portion and then bending an end part of the off-set portion into the form of a first depending leg with the insulating material on the outside of the leg. The other end of the sheet is bent into the form of a second depending leg with the insulating material on the inside of the leg. The two depending legs then are juxtaposed and the two ends compressed into the form of a joint wherein electrically conductive surfaces are in face-to-face contact, providing continuity of electrical conductivity.

DESCRIPTION OF PREFERRED EMBODIMENTS

Figure 1:
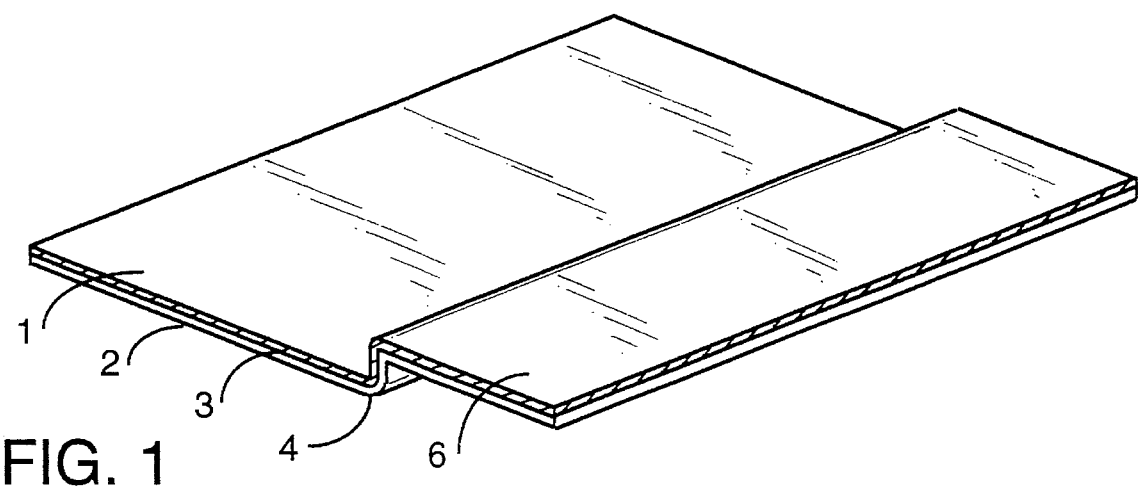
FIG. 1 is an isometric view of one end of the sheet provided with an off-set portion.

FIG. 1 shows a first stage of formation of the inventive joint wherein a first end of a sheet 1 comprises an electrically conductive layer 2 e.g. of metal such as aluminum, and an electrically insulative layer 3, e.g. of a polyvinyl chloride (PVC) shown in hatched lines. End 1 of the sheet is bent as at 4, providing an off-set portion 6.

Figure 2:
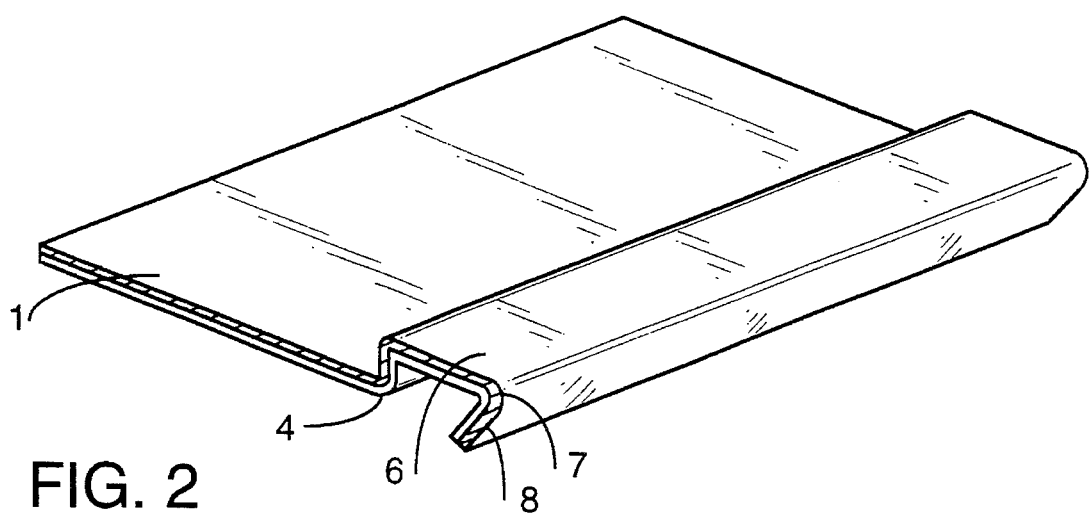
FIG. 2 is an isometric view of said one end of the sheet wherein a part of the off-set portion is bent into the form of a first dependent leg.

As shown in FIG. 2, off-set portion 6 is bent as at 7, forming a first dependent leg 8 at an acute angle to the remainder of the off-set portion and wherein the insulative layer 3 is on the outside of the bend.

Figure 3:
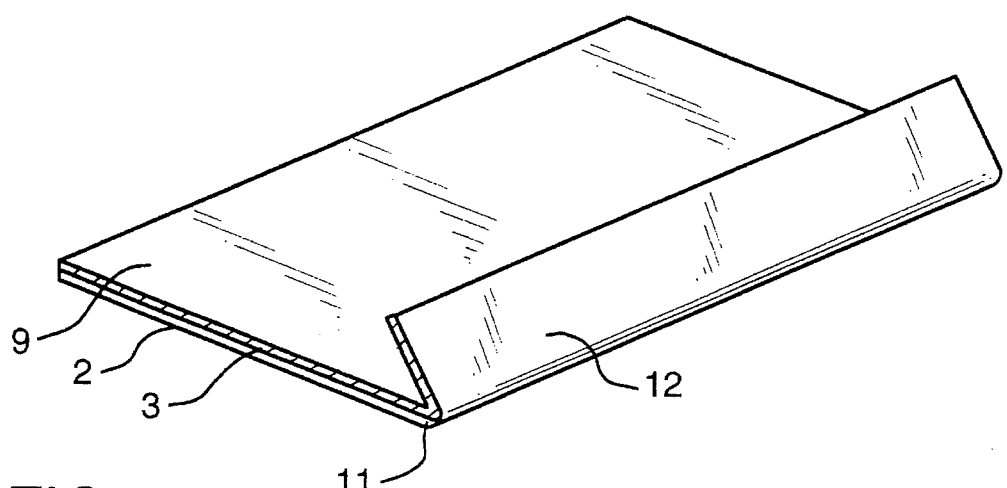
FIG. 3 is an isometric view of the other end of the sheet wherein one edge of the sheet is bent into the form of a second dependent leg.

In FIG. 3 there is shown a second end 9 of the composite sheet, bent as at 11, providing a second dependent leg 12 forming an acute angle with the remainder of the second end of the sheet and wherein the insulative layer 3 is on the inside of the bend.

Figure 4:
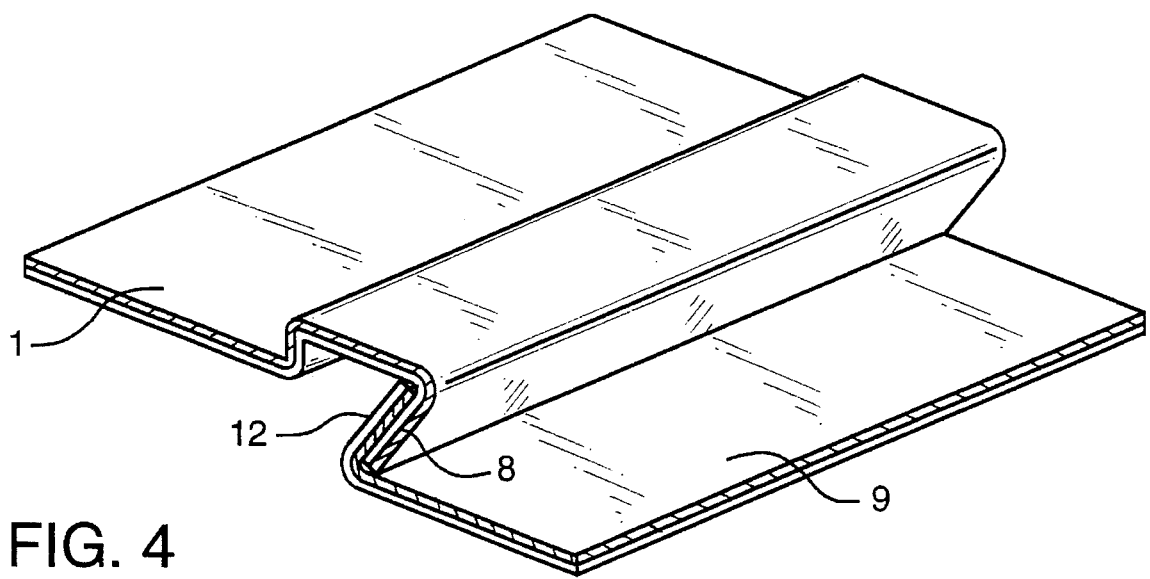
FIG. 4 is an isometric view of the two ends of the sheet assembled with the first and second legs juxtaposed.
Figure 5:
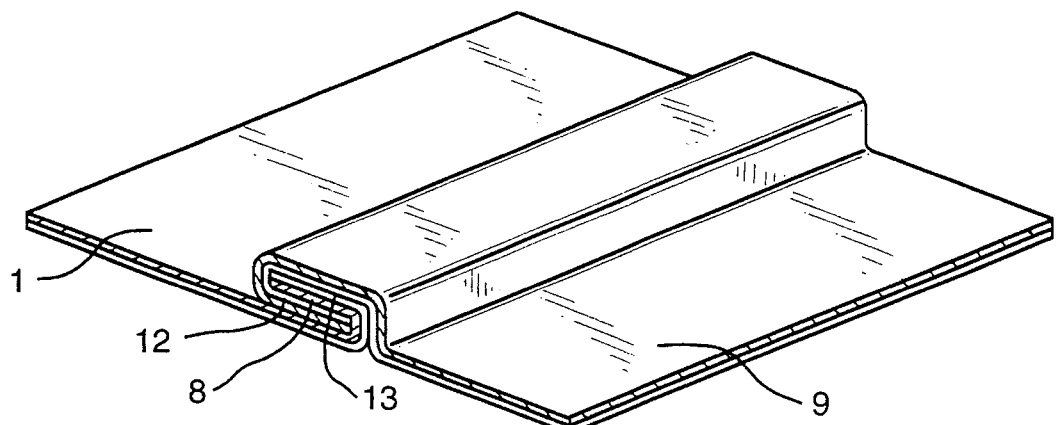
FIG. 5 is an isometric view of the juxtaposed two ends of the sheet, compressed into the form of the final joint.

As shown in FIG. 4, when end 1 and end 9 of the formed sheet are assembled, the first dependent leg 8 is juxtaposed to the second dependent leg 12 and, when this assembly is compressed, as shown in FIG. 5, the collapsed dependent legs 8 and 12 provide continuous metal-to-metal contact, as at 13.

Figure 6:
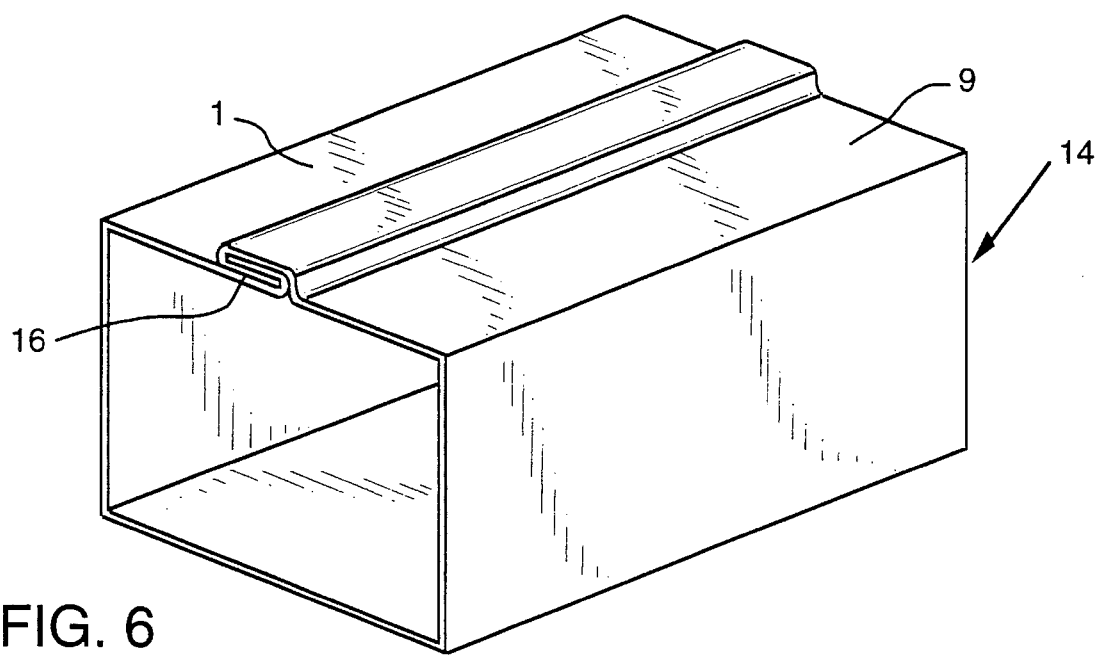
FIG. 6 is an isometric view of a hollow housing formed of sheet material having a joint as shown in FIG. 5.

In FIG. 6, a hollow housing denoted generally by the numeral 14 is formed with ends 1 and 9 of the sheet material connected with a formed joint 16, as above-described. Such a housing is useful for surrounding and magnetically shielding an electrical apparatus.

The joint of the invention requires no separate joining means such as rivets, screws, clips or the like but is formed only by bending and assembling the ends of the composite sheet material and compressing the assembly thereby locking the ends in place and forming a continuous electrical contact between the compressed ends of the sheet.

What is claimed is:

1. A method of forming an electrically conductive joint in a sheet of material having top and bottom surfaces wherein one surface is formed of an electrically conductive layer and the other surface is formed of a layer of electrically insulative material overlying and bonded to the electrically conductive layer, comprising off-setting a portion of a first end of said sheet material, said off-set portion extending parallel to the top and bottom surfaces of said sheet material and spaced from the remainder of said one end of said sheet material, bending an edge part of the off-set portion into the form of a first dependent leg forming an angle with the remainder of the off-set portion and having said insulative layer on the outside of the bend, bending an edge portion of a second end of said sheet material into the form of a second dependent leg forming an angle with the remainder of said second end of said sheet material and having said insulative layer on the inside of the bend, assembling the first and second ends of the sheet material with the first and second dependent legs juxtaposed to each other, and compressing the assembly to collapse said first and second legs into a position parallel to the top and bottom surfaces of the sheet material whereby conductive surfaces of the first and second legs are in face-to-face relationship forming a continuous electrically conductive contact.

2. A method of making an electrically conductive joint comprising off-setting a portion of one end of a composite sheet having a conductive layer and an insulative layer, bending a part of the off-set portion into a first leg with the insulative layer on the outside of the bend, bending an edge portion of a second end of the sheet into a second leg with the insulative layer on the inside of the bend, juxtaposing the two legs and compressing them to form a continuous contact between the conductive layers of the two ends.

3. A joint formed by the method of claim 1.

4. A joint formed by the method of claim 2.

5. An electrically conductive joint formed of a sheet material comprising a layer of conductive material and having one surface of the sheet coated with an electrically insulative layer, comprising a first end of the sheet having an off-set portion and an edge part of the off-set portion bent into the form of a first depending leg forming an angle with the remainder of the off-set portion with the insulative layer on the outside of the bend, a second end of the sheet having an edge portion thereof bent into the form of a second dependent leg forming an angle with the remainder of the second end of the sheet with the insulative layer on the inside of the bend, wherein, when the first and second ends of the sheet are juxtaposed with the first and second legs in face-to-face relationship with each other and compressed, the joint provides continuous electrical contact between the electrically conductive layers of the two ends of the sheet.

6. A hollow housing for surrounding and magnetically shielding an electrical apparatus, comprising a sheet having an electrically conductive layer and an electrically insulative layer, first and second ends of the sheet forming a joint in accordance with claim 3 whereby there is provided a continuous electrical circuit about a periphery of the housing.

7. A hollow housing for surrounding and magnetically shielding an electrical apparatus, comprising a sheet having an electrically conductive layer and an electrically insulative layer, first and second ends of the sheet forming a joint in accordance with claim 4 whereby there is provided a continuous electrical circuit about a periphery of the housing.

8. A joint according to claim 3, wherein the electrically conductive layer is aluminum.

9. A joint according to claim 6, wherein the electrically insulative layer comprises a polyvinyl chloride.

* * * * *